(12) United States Patent
Chou et al.

(10) Patent No.: US 9,526,173 B2
(45) Date of Patent: Dec. 20, 2016

(54) ATTACHMENT FOR PREVENTING LIQUID FROM ADHERING TO ELECTRONIC COMPONENT

(71) Applicant: FANUC Corporation, Minamitsuru-gun, Yamanashi (JP)

(72) Inventors: Norihiro Chou, Minamitsuru-gun (JP); Kiichi Inaba, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 124 days.

(21) Appl. No.: 13/955,133

(22) Filed: Jul. 31, 2013

(65) Prior Publication Data

US 2014/0043778 A1 Feb. 13, 2014

(30) Foreign Application Priority Data

Aug. 7, 2012 (JP) .................................. 2012-174862

(51) Int. Cl.
*H05K 1/18* (2006.01)
*H05K 5/03* (2006.01)
*H01R 13/52* (2006.01)

(52) U.S. Cl.
CPC ................ *H05K 1/181* (2013.01); *H05K 5/03* (2013.01); *H01R 13/5227* (2013.01); *Y10S 220/06* (2013.01)

(58) Field of Classification Search
CPC ...... H05K 5/03; H05K 1/181; H01R 13/5227; Y10S 220/06
USPC ........................................................ 361/810
See application file for complete search history.

(56) References Cited

U.S. PATENT DOCUMENTS

| | | | |
|---|---|---|---|
| 4,609,126 A * | 9/1986 | Janda | 220/374 |
| 4,871,884 A * | 10/1989 | Hayashi | 174/560 |
| 6,166,327 A * | 12/2000 | Saito et al. | 174/50 |
| 6,285,544 B1 * | 9/2001 | Chandramohan | G06F 1/181 206/305 |
| 7,923,670 B2 * | 4/2011 | Hirano et al. | 219/757 |
| 2004/0007373 A1 * | 1/2004 | Higuchi et al. | 174/50 |
| 2005/0227542 A1 | 10/2005 | Fukushima et al. | |

(Continued)

FOREIGN PATENT DOCUMENTS

DE 196 41 553 C2 12/1999
DE 201 05 123 U1 7/2001

(Continued)

*Primary Examiner* — Jinhee Lee
*Assistant Examiner* — Abhishek Rathod
(74) *Attorney, Agent, or Firm* — Drinker Biddle & Reath LLP

(57) ABSTRACT

An attachment capable of preventing liquid from adhering to a specific electronic component within an electronic device. An electronic substrate has an attachment which can be attached to and detached from the electronic substrate. The attachment has an attachment part detachably attached to an edge of the electronic substrate; and a shield part connected to or integrally formed with the attachment part. The attachment part is a clip-like member having a certain degree of elasticity, and is configured to grip an edge of the electronic substrate so that the attachment is held at a predetermined place. The shield part has an inclined surface, and is configured to shield the electronic component so that liquid, such as a splash or droplet moving toward the electronic component, does not adhere to the component when the attachment is held at the predetermined place.

8 Claims, 3 Drawing Sheets

(56) References Cited

U.S. PATENT DOCUMENTS

2013/0221813 A1  8/2013  Maisch
2013/0229741 A1* 9/2013  Yuasa ........................... 361/104

FOREIGN PATENT DOCUMENTS

| DE | 10 2005 016 614 A1 | 11/2005 |
| DE | 10 2010 033 319 A1 | 2/2012 |
| DE | 10 2010 042 277 A1 | 4/2012 |
| EP | 1753283 A2 | 2/2007 |
| JP | H03-48723 U | 3/1991 |
| JP | H03-77478 U | 8/1991 |
| JP | H06327121 * | 11/1994 |
| JP | H11-233955 A | 8/1999 |
| JP | 2001-185866 A | 7/2001 |
| JP | 2007-048946 A | 2/2007 |
| JP | 2010-056447 A | 3/2010 |

* cited by examiner

ATTACHMENT FOR PREVENTING LIQUID FROM ADHERING TO ELECTRONIC COMPONENT

RELATED APPLICATION DATA

This application claims priority under 35 U.S.C. §119 and/or §365 to Japanese Application No. 2012-174862 filed Aug. 7, 2012, the entire contents is incorporated herein by reference.

BACKGROUND OF THE INVENTION

1. Field of the Invention

The present invention relates to an attachment for preventing liquid from adhering to an electronic component, in particular, to an attachment for preventing liquid from adhering to an electronic component which is mounted on an electronic substrate of a motor drive unit.

2. Description of the Related Art

In the prior art, various means for preventing liquid from adhering to an electronic component have been proposed. For example, Japanese Unexamined Patent Publication (Kokai) No. 2001-185866 discloses an electronic device attached to an interior attachment surface such as a wall surface or a window frame, wherein the device has a drip-proof structure having an upper edge adhered to the attachment surface and a chute for guiding water drops.

On the other hand, a structure for preventing liquid from adhering to an electronic device used in a numerical controller, etc., has been proposed. For example, Japanese Unexamined Patent Publication (Kokai) No. 2007-048946 discloses a casing of an electronic device containing an electronic substrate and a fan motor for cooling an electronic component mounted on the substrate, wherein a lower surface of an upper part of the casing attached to the fan motor is formed as an inclined surface so that water or oil accumulated in a housing of the fan motor flows as a droplet along the inclined surface, in order to prevent the droplet from adhering to the electronic component.

In the drip-proof structure of Japanese Unexamined Patent Publication (Kokai) No. 2001-185866, a water drop is prevented from adhering to the electronic component attached to the wall surface or the window frame. However, the drip-proof structure can prevent a water drop, which flows on the wall surface or the window frame only, from adhering to the electronic component. Therefore, in the drip-proof structure of Japanese Unexamined Patent Publication (Kokai) No. 2001-185866, it is difficult to prevent a water drop, which scatters from a portion other than the wall surface or the window frame, from adhering to the electronic component.

In contrast, in Japanese Unexamined Patent Publication (Kokai) No. 2007-048946, the casing structure is effective in protecting the electronic component from water droplets which are moved from the fan motor, etc. However, it is necessary to previously form the casing structure so as to have a special shape such as having inclined surface, etc. Therefore, it is necessary to prepare different casing structures for use, depending on whether the drip-proof property is required or not, which is disadvantageous in terms of parts management and cost.

SUMMARY OF THE INVENTION

The object of the present invention is to provide an attachment capable of assuredly preventing liquid from adhering to a specific electronic component within an electronic device, without significantly changing the design of the electronic device.

The present invention provides an attachment for protecting an electronic component mounted on an electronic substrate of an electronic device from liquid, the attachment comprising: an attachment part which is detachably attached to the electronic substrate; a shield part which is connected to or integrally formed with the attachment part, the shield part being configured to shield an electronic component to be protected from liquid moving toward the electronic component, wherein the shield part has an inclined surface which guides shielded liquid so that the shielded liquid flows to a portion of the electronic device other than the electronic component to be protected.

In a preferred embodiment, the attachment part of the attachment is an elastic clip-like member configured to grip an edge of the electronic substrate.

In another preferred embodiment, the shield part of the attachment is configured to cover the entirety of the electronic component to be protected.

In yet another preferred embodiment, the shield part of the attachment is positioned above the electronic component to be protected.

In a further preferred embodiment, the shield part of the attachment is positioned below the electronic component to be protected.

BRIEF DESCRIPTION OF THE DRAWINGS

The above and other objects, features and advantages of the present invention will be made more apparent by the following description of the preferred embodiments thereof, with reference to the accompanying drawings, wherein.

DETAILED DESCRIPTION

Figure 1A:
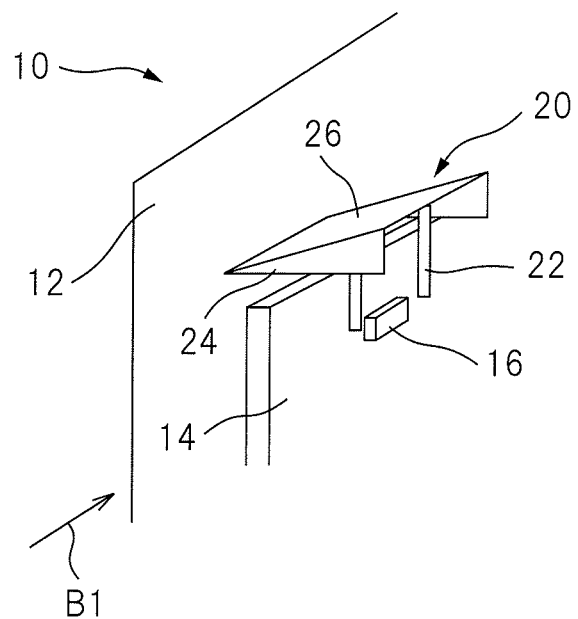
FIG. 1A is a perspective view showing an example wherein an attachment according to a first embodiment of the invention is applied to an electronic device.
Figure 1B:
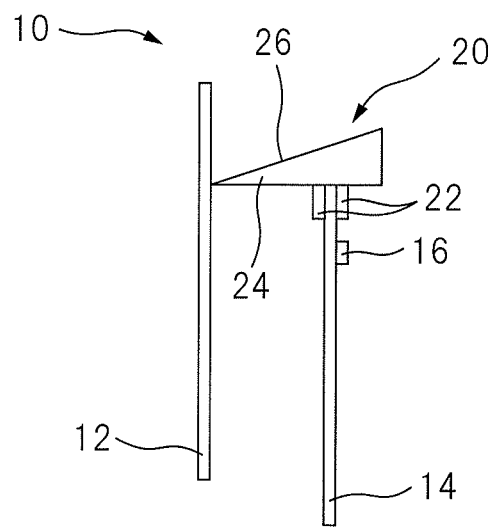
FIG. 1B is a side view of the configuration of FIG. 1A.

FIG. 1A is a perspective view showing a state wherein an attachment according to a first embodiment of the invention is applied to an electronic substrate of an electronic device; and FIG. 1B is a side view of the configuration of FIG. 1A viewed in a direction of an arrow B1. An electronic device 10, such as a motor drive unit or numerical controller, has a schematically shown casing or wall part 12, an electronic substrate 14 arranged in casing or wall part 12, and at least one electronic component mounted on electronic substrate 14. In this case, electronic component 16 is an object to be protected so that liquid such as cutting oil or cutting fluid does not adhere to the object. In addition, the term "liquid" used herein includes liquid containing solid substances such as machining chips or dust.

Electronic substrate 14 has an attachment 20 which can be attached to and detached from electronic substrate 14. Concretely, attachment 20 has an attachment part 22 which is detachably attached to an edge (an upper edge in the illustrated embodiment) of electronic substrate 14; and a shield part 24 which is connected to or integrally formed with attachment part 22. Attachment part 22 is a clip-like member having a certain degree of elasticity, and is configured to grip an edge of electronic substrate 14 so that attachment 20 is held at a predetermined place. Although attachment part 22 is illustrated as a clip-like member, it may alternatively be a screw or adhesive agent having relatively low adhesion strength.

Shield part 24 has an inclined surface 26, which is configured to shield electronic component 16 so that liquid, such as a splash or droplet moving toward electronic component 16, does not adhere to the component when attachment 20 is held at the predetermined place. In the embodiment of FIGS. 1A and 1B, a case wherein the droplet falls from above electronic component 16, or a case wherein a device, such as a fan motor (not shown) which scatters liquid, is positioned above electronic component 16, is assumed. In such a case, the splash or droplet is blocked by shield part 24 (or inclined surface 26) positioned above electronic component 16. Thus, the blocked splash or droplet does not reach electronic component 16, flows on inclined surface 26, and is guided to a part of the electronic device other than the object to be protected. The part of the electronic device to which the splash or droplet is guided is not adversely affected when it becomes wet, and such a part is an inner surface of wall part 12 in the drawings. In other words, in the first embodiment, inclined surface 26 has a function of shielding the liquid, and also functions as a fluid path to guide the liquid so as to flow to a part of the electronic device other than the object to be protected.

Figure 2A:
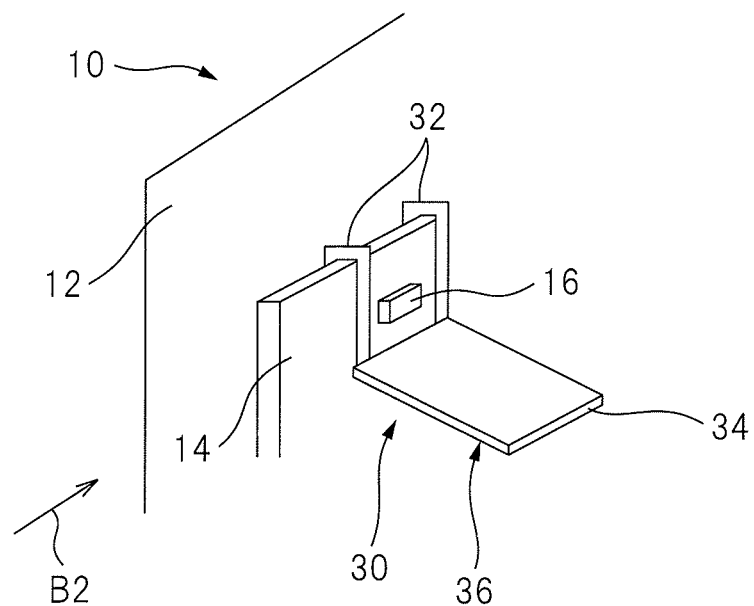
FIG. 2A is a perspective view showing an example wherein an attachment according to a second embodiment of the invention is applied to an electronic device.
Figure 2B:
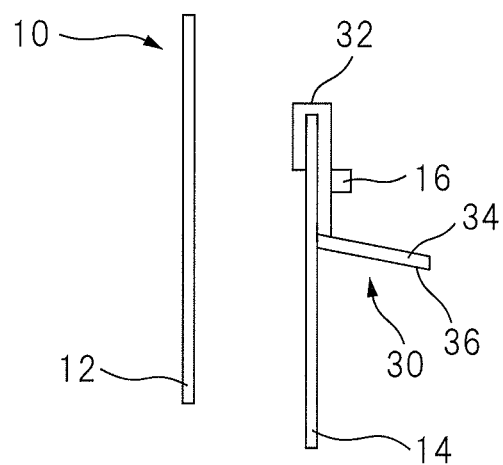
FIG. 2B is a side view of the configuration of FIG. 2A.

FIG. 2A is a perspective view showing a state wherein an attachment according to a second embodiment of the invention is applied to an electronic substrate of an electronic device; and FIG. 2B is a side view of the configuration of FIG. 2A viewed in a direction of an arrow B2. Similarly to the first embodiment, electronic device 10, such as a motor drive unit or numerical controller, has schematically shown casing or wall part 12, electronic substrate 14 arranged in casing or wall part 12, and at least one electronic component mounted on electronic substrate 14. In this case, electronic component 16 is an object to be protected so that liquid such as cutting oil or cutting fluid does not adhere to the object.

Electronic substrate 14 has an attachment 30 which can be attached to and detached from electronic substrate 14. Concretely, attachment 30 has an attachment part 32 which is detachably attached to an edge (an upper edge in the illustrated embodiment) of electronic substrate 14; and a shield part 34 which is connected to or integrally formed with attachment part 32. Attachment part 32 is a clip-like member having a certain degree of elasticity, and is configured to grip an edge of electronic substrate 14 so that attachment 30 is held at a predetermined place. Although attachment part 32 is illustrated as a clip-like member, it may alternatively be a screw or adhesive agent having relatively low adhesion strength.

Shield part 34 has an inclined surface 36, which is configured to shield electronic component 16 so that liquid, such as a splash or droplet moving toward electronic component 16, does not adhere to the component when attachment 30 is held at the predetermined place. In the embodiment of FIGS. 2A and 2B, a case wherein a device, such as a fan motor (not shown) which scatters liquid, is positioned below electronic component 16, is assumed. In such a case, the splash or droplet is blocked by shield part 34 (or inclined surface 36) positioned below electronic component 16. Thus, the blocked splash or droplet does not reach electronic component 16, flows on inclined surface 36, and is guided to a part of the electronic device other than the object to be protected. The part of the electronic device to which the splash or droplet is guided is not adversely affected when it becomes wet, and such a part is a bottom part of casing 12 of device 10 in the drawings. In other words, in the second embodiment, inclined surface 36 has a function of shielding the liquid, and also functions as a fluid path to guide the liquid so as to flow to a part of the electronic device other than the object to be protected.

Figure 3A:
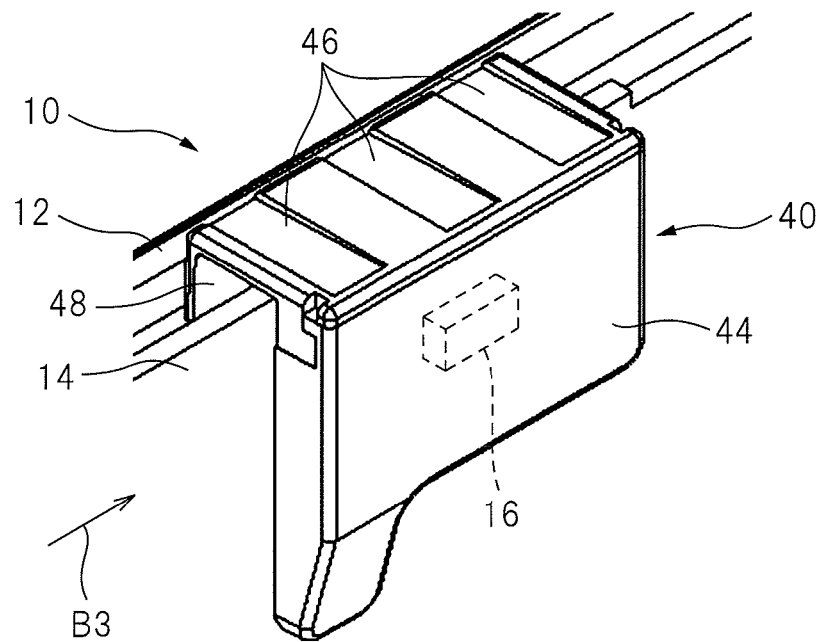
FIG. 3A is a perspective view showing an example of a cover for covering a component to be protected.
Figure 3B:
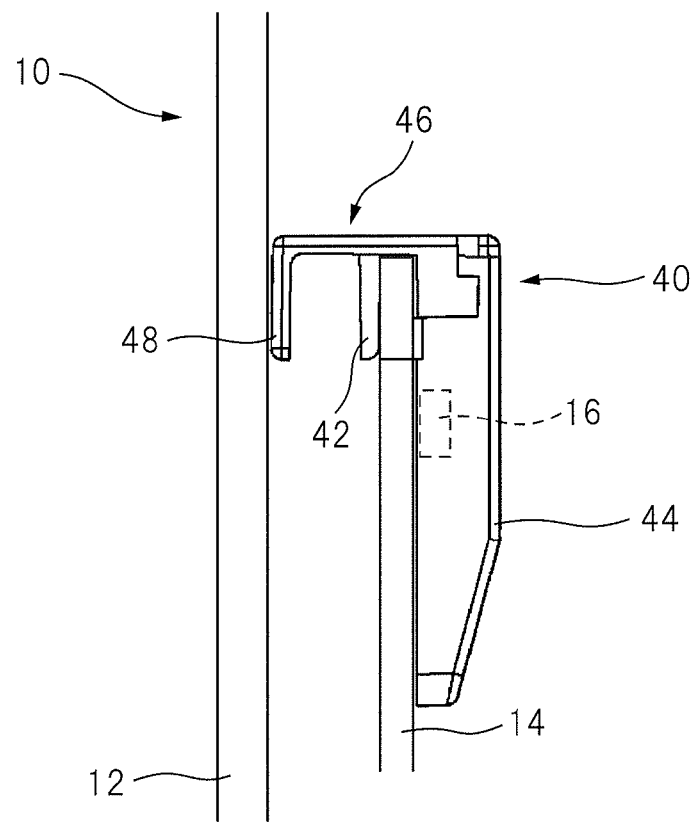
FIG. 3B is a side view of the configuration of FIG. 3A.

FIG. 3A is a perspective view showing a state wherein an attachment according to a third embodiment of the invention is applied to an electronic substrate of an electronic device; and FIG. 3B is a side view of the configuration of FIG. 3A viewed in a direction of an arrow B3. Similarly to the first and second embodiments, electronic device 10, such as a motor drive unit or numerical controller, has schematically shown casing or wall part 12, electronic substrate 14 arranged in casing or wall part 12, and at least one electronic component mounted on electronic substrate 14. In this case, electronic component 16 is an object to be protected so that liquid such as cutting oil or cutting fluid does not adhere to the object.

Electronic substrate 14 has an attachment 40 which can be attached to and detached from electronic substrate 14. Concretely, attachment 40 has an attachment part 42 which is detachably attached to an edge (an upper edge in the illustrated embodiment) of electronic substrate 14; and a shield part 44 which is connected to or integrally formed with attachment part 42. As shown in FIG. 3B, attachment part 42 is a clip-like member having a certain degree of elasticity, and is configured to grip an edge of electronic substrate 14 so that attachment 40 is held at a predetermined place. Although attachment part 42 is illustrated as a clip-like member, it may alternatively be a screw or adhesive agent having relatively low adhesion strength.

Shield part 44 is configured to cover the entirety of electronic component 16 to be protected so that liquid, such as splash or droplet moving toward electronic component 16, does not adhere to the component when attachment 30 is held at the predetermined place. Therefore, when the splash or droplet from the fan motor (not shown) is moved toward electronic component 16 in any direction, the splash or droplet is blocked by shield part 44.

Shield part 44 has an inclined surface 46 at the upper portion thereof. The splash or droplet, which moves toward electronic component 16 from above the component, is blocked by inclined surface 46 or a horizontal surface adjacent the inclined surface. The blocked splash or droplet does not reach electronic component 16, flows on inclined surface 46, and is guided to a part of the electronic device other than the object to be protected. Thus, the part of the electronic device to which the splash or droplet is guided is not adversely affected when it becomes wet, and such a part is an inner surface of wall part 12 in the drawings. Further, the splash or droplet, which moves toward electronic component 16 from below the component or the lateral side the component, is blocked by the shield part which covers the entirety of electronic component 16. The blocked splash or droplet is guided or falls to a part of the electronic device other than the object to be protected. The part of the electronic device to which the splash or droplet is guided is not adversely affected when it becomes wet, and such a part is a bottom part of casing 12 of device 10 in the drawings. In this case, it is preferable that a member 48 (in the drawing, a strip-shaped member which downwardly extends from a casing-side edge of inclined surface 46) is arranged at the upper part of attachment 40 so that member 48 contacts wall part 12 over a predetermined area. Member 48 may function as a liquid guiding part for properly guiding the liquid, which flows on inclined surface 46, to a lower part along wall part 12.

According to the present invention, the attachment can be detached from the electric substrate, whereby the desired drip-proof function can be obtained without changing the design of the casing (for example, previously providing the casing with a drip-proof structure). Further, since only the electronic component, to which liquid is harmful, is protected in the invention, the entirety of the device may be compact and is advantageous in terms of cost and space. In addition, the attachment is user-friendly, since it can be easily replaced if it becomes corroded or damaged.

By constituting the attachment part of the attachment as a clip-like member, the attachment can be easily attached to or detached from the electronic substrate.

The shield part of the attachment can be variously designed corresponding to the moving direction of the liquid, etc. For example, the shield part may be formed so that the shield part protects the entirety, the upper part or the lower part of the electronic component to be protected.

While the invention has been described with reference to specific embodiments chosen for the purpose of illustration, it should be apparent that numerous modifications could be made thereto, by a person skilled in the art, without departing from the basic concept and scope of the invention.

The invention claimed is:

1. An attachment for protecting an electronic component from liquid, the electronic component mounted on an electronic wiring substrate of an electronic device and enclosed inside a casing with the electronic wiring substrate, the attachment comprising:

an attachment part that is configured to grip over a side edge of the electronic wiring substrate, the electronic wiring substrate being a planar board with the electronic component mounted thereon, the attachment part located inside the casing, and is detachably attached to the electronic wiring substrate; and a shield part located inside the casing, the shield part being connected to or integrally formed with the attachment part, the shield part being configured to shield the electronic component to be protected from a splash or droplet that is moving toward the electronic component inside the casing, wherein the shield part has an inclined surface which guides the splash or the droplet that is moving towards the electronic component away from the electronic component once the splash or droplet engages with the shield part, so that the splash or the droplet flows to a portion of the electronic device other than a location where the electronic component is located, and wherein the attachment part includes two legs that are arranged one on each side of the electronic component and are also located on a surface of the electronic wiring substrate where the electronic component is mounted.

2. The attachment as set forth in claim 1, wherein the shield part of the attachment is configured to cover an entirety of the electronic component.

3. The attachment as set forth in claim 1, wherein the shield part of the attachment is positioned above the electronic component.

4. The attachment as set forth in claim 1, wherein the shield part of the attachment is positioned below the electronic component.

5. The attachment as set forth in claim 1, wherein the attachment part includes two walls that are arranged on each side of the electronic component and has an U-shaped form to reach around the edge of the electronic wiring substrate.

6. The attachment as set forth in claim 1, wherein the inclined surface of the shield part is arranged to be located spaced apart from the side edge of the electronic wiring substrate such that the splash or the droplet flows towards the casing.

7. The attachment as set forth in claim 1, wherein the attachment part includes front legs that attach to a front side of the electronic wiring substrate, and rear legs that attach to a rear side of the electronic wiring substrate, the electronic wiring substrate sandwiched between the front legs and the rear legs.

8. The attachment as set forth in claim 1, wherein a plurality of electronic components are mounted on the electronic wiring substrate, and the shield part of the attachment is configured to cover a part of the plurality of electronic components.

* * * * *